(12) United States Patent
Motz

(10) Patent No.: US 11,879,951 B2
(45) Date of Patent: Jan. 23, 2024

(54) MAGNETIC FIELD SENSOR APPARATUS

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 437 days.

(21) Appl. No.: 16/395,641

(22) Filed: Apr. 26, 2019

(65) Prior Publication Data

US 2019/0346515 A1 Nov. 14, 2019

(30) Foreign Application Priority Data

May 8, 2018 (DE) .......................... 102018111011.1

(51) Int. Cl.
| | |
|---|---|
| *G01R 33/07* | (2006.01) |
| *H01L 23/495* | (2006.01) |
| *H10N 52/00* | (2023.01) |
| *H10N 52/80* | (2023.01) |
| *G01R 33/09* | (2006.01) |
| *G01D 5/14* | (2006.01) |
| *G01R 33/00* | (2006.01) |

(52) U.S. Cl.
CPC ............ *G01R 33/07* (2013.01); *G01D 5/142* (2013.01); *G01R 33/0047* (2013.01); *G01R 33/0052* (2013.01); *G01R 33/0094* (2013.01); *G01R 33/09* (2013.01); *H01L 23/495* (2013.01); *H10N 52/00* (2023.02); *H10N 52/80* (2023.02)

(58) Field of Classification Search
CPC .... G01R 33/07; G01R 33/072; G01R 33/075; G01R 33/077; G01R 33/09; G01R 33/091; G01R 33/093; G01R 33/095; G01R 33/096; G01R 33/098; G01R 33/0047; G01R 33/0052; G01R 33/0094; G01R 15/20; G01R 15/202; G01R 15/205; G01R 15/207; G01D 5/142; G01D 5/145; G01D 5/147; H01L 23/495; H01L 43/04; H01L 43/06; H10N 52/00; H10N 52/80

See application file for complete search history.

(56) References Cited

U.S. PATENT DOCUMENTS

| | | | |
|---|---|---|---|
| 2008/0100290 A1* | 5/2008 | Shoji | G01R 33/093 324/252 |
| 2009/0167301 A1* | 7/2009 | Ausserlechner | G01R 33/0035 324/252 |
| 2011/0133732 A1* | 6/2011 | Sauber | G01R 33/0023 324/251 |
| 2012/0091994 A1* | 4/2012 | Han | G01R 33/07 324/117 H |

(Continued)

FOREIGN PATENT DOCUMENTS

| | | |
|---|---|---|
| CN | 1957261 A | 5/2007 |
| CN | 102483443 A | 5/2012 |

(Continued)

*Primary Examiner* — David M Schindler
(74) *Attorney, Agent, or Firm* — Harrity & Harrity, LLP

(57) ABSTRACT

Magnetic field sensor apparatuses are discussed. A magnetic field sensor apparatus in accordance with one example implementation in this case comprises a coil and a magnetic field sensor. A chip carrying the coil and the magnetic field sensor is arranged on a leadframe. The leadframe comprises a cutout.

18 Claims, 8 Drawing Sheets

(56) References Cited

U.S. PATENT DOCUMENTS

| | | | |
|---|---|---|---|
| 2014/0253115 A1* | 9/2014 | Ausserlechner | G01R 33/072 |
| | | | 324/251 |
| 2015/0022198 A1 | 1/2015 | David et al. | |
| 2015/0185293 A1* | 7/2015 | Milano | G01R 33/02 |
| | | | 324/251 |
| 2017/0030979 A1* | 2/2017 | Cesaretti | G01R 33/07 |
| 2017/0102344 A1 | 4/2017 | Lei et al. | |
| 2018/0149677 A1* | 5/2018 | Milano | G01R 15/148 |
| 2018/0321332 A1* | 11/2018 | Tanabe | G01R 33/025 |

FOREIGN PATENT DOCUMENTS

| | | |
|---|---|---|
| CN | 102798828 A | 11/2012 |
| CN | 103154775 A | 6/2013 |
| CN | 104897942 A | 9/2015 |
| CN | 206649142 U | 11/2017 |
| CN | 107567589 A | 1/2018 |
| DE | 102 31 194 A1 | 2/2004 |
| DE | 11 2010 004 674 B4 | 6/2016 |
| DE | 10 2008 061 479 B4 | 9/2016 |
| DE | 10 2016 103 325 A1 | 8/2017 |
| JP | 2011185914 A * | 9/2011 |

* cited by examiner

MAGNETIC FIELD SENSOR APPARATUS

RELATED APPLICATION

This application claims priority under 35 U.S.C. § 119 to German Patent Application No. 102018111011.1, filed on May 8, 2018, the contents of which are incorporated by reference herein in their entirety.

TECHNICAL FIELD

The present application relates to magnetic field sensor apparatuses.

BACKGROUND

Magnetic field sensor apparatuses are used in various applications to measure magnetic fields. Magnetic field sensor apparatuses of this type are used, for example, for indirectly measuring currents by means of a measurement of the magnetic field generated by the current, or else in other applications in which magnetic fields are intended to be measured. In some applications, it is desirable here to measure magnetic fields over a high frequency bandwidth, for example from static magnetic fields up to radio-frequency magnetic fields having a frequency of up to 100 kHz or into the MHz range.

In order to produce magnetic field sensor apparatuses of this type, magnetic field sensors such as Hall sensors and coils can be produced, for example, within semiconductor processes on a chip, for example a silicon chip. In some fabrication processes, such a chip is then mounted onto a leadframe, thereby establishing electrical connections to the outside world. In a leadframe of this type, eddy currents can arise, however, which impair the magnetic field measurements by means of the Hall sensor and/or the coil.

SUMMARY

A magnetic field sensor apparatus, as recited in the claims, is provided. The dependent claims define further implementations and also a system comprising a magnetic field sensor apparatus of this type.

In accordance with one example implementation, a magnetic field sensor apparatus is provided, comprising:
  a chip, wherein the chip comprises a magnetic field sensor and a coil, and
  a leadframe composed of an electrically conductive material, wherein the leadframe comprises a cutout,
  wherein the coil, the magnetic field sensor and the cutout are arranged in such a way that in the case of an orthogonal projection of the magnetic field sensor and of the cutout onto a plane defined by the turns of the coil:
    the magnetic field sensor is arranged within an area enclosed by an outer turn of the coil,
    at least 75% of the sensitive area of the magnetic field sensor lies within the cutout, and
    at least 25% of the area enclosed by the outer turn of the coil lies within the cutout.

In accordance with another example implementation, a magnetic field sensor apparatus is provided, comprising:
  a chip, wherein the chip comprises a magnetic field sensor and a coil, wherein the coil and the magnetic field sensor are arranged in such a way that in the case of an orthogonal projection of the magnetic field sensor onto a plane defined by the turns of the coil, a sensitive area of the magnetic field sensor lies within an area enclosed by an outer turn of the coil, and
  a non-conductive carrier, wherein the chip is fitted on the non-conductive carrier.

In accordance with a further example implementation, a magnetic field sensor apparatus is provided, comprising:
  a chip, wherein the chip comprises a coil, and
  a leadframe composed of an electrically conductive material, wherein the leadframe comprises a cutout,
  wherein the coil and the cutout are arranged in such a way that in the case of an orthogonal projection of the cutout onto a plane defined by the turns of the coil:
    at least 25% of the area enclosed by the outer turn of the coil lies within the cutout.

The above summary serves merely as a brief overview of some features of some example implementations and should not be interpreted as restrictive.

DETAILED DESCRIPTION

Various example implementations are explained in detail below. It should be emphasized that these example implementations serve merely for illustration and should not be interpreted as restrictive. In particular, other example implementations can also contain fewer components than those illustrated, and/or can contain additional components, for example components used in conventional magnetic field sensor apparatuses. Variations, modifications and details described for one of the example implementations are also applicable to other example implementations and are therefore not described repeatedly. Features of different example implementations can be combined with one another in order to form further example implementations. Unless indicated otherwise, expressions such as "conductive", "non-conductive", "insulator", "conductor track", etc. relate to the electrical conductivity.

Figure 1A:
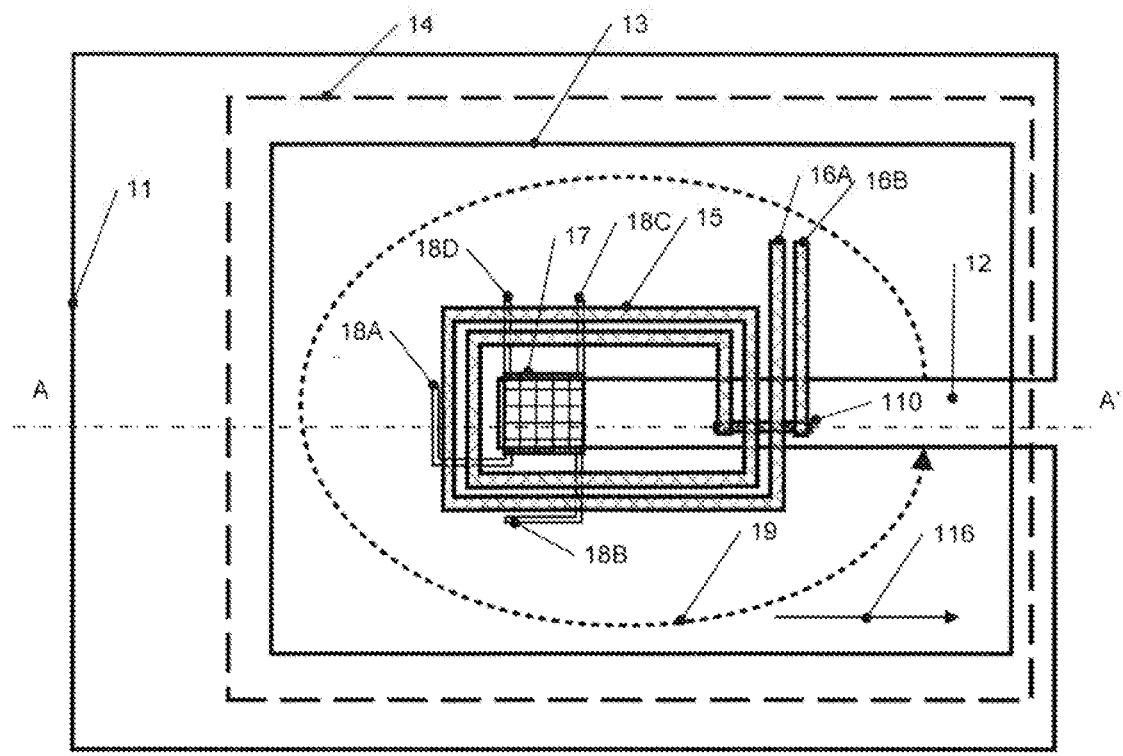
FIG. 1A is a plan view of a magnetic field sensor apparatus in accordance with one example implementation.
Figure 1B:
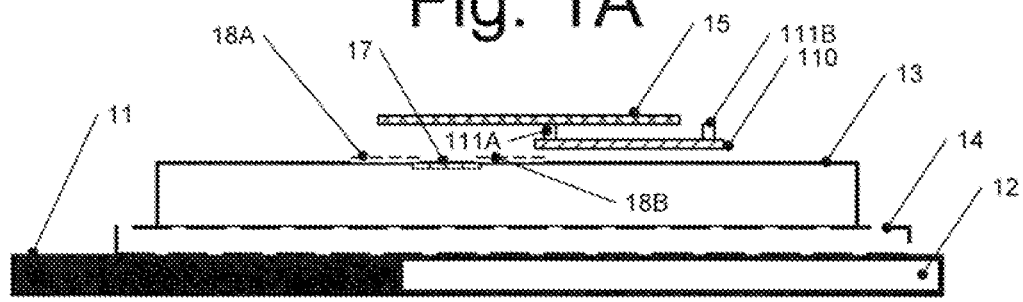
FIG. 1B is a schematic cross-sectional view of the magnetic field sensor apparatus from FIG. 1A along a line A-A' in FIG. 1A.
Figure 1C:
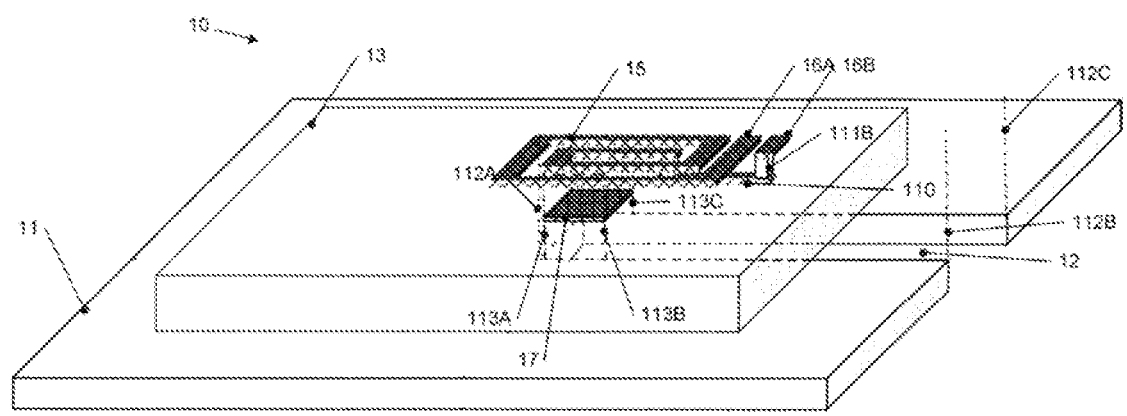
FIG. 1C is a schematic perspective view of the magnetic field sensor apparatus from FIGS. 1A and 1B.
Figure 1D:
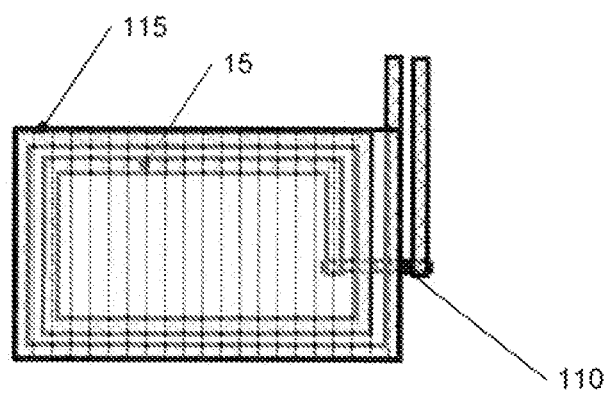
FIG. 1D is an illustration for illustrating a coil area in the example implementation from FIGS. 1A-1C.

FIGS. 1A-1D show a magnetic field sensor apparatus 10 in accordance with some example implementations. In this case, FIG. 1A shows a schematic plan view of the magnetic field sensor apparatus 10, FIG. 1B shows a schematic cross-sectional view of the magnetic field sensor apparatus 10 for instance along a line A-A' in FIG. 1A, FIG. 1C shows a schematic perspective view of the magnetic field sensor apparatus 10, and FIG. 1D shows a coil 15 of the magnetic field sensor apparatus 10 for elucidating a coil area.

The magnetic field sensor apparatus 10 comprises a chip 13, which is fitted on a leadframe 11 using one or more insulation and/or adhesive layer(s) 14. The chip 13 can be in particular a semiconductor chip such as a silicon chip.

A magnetic field sensor 17 is formed on the chip 13. In the example implementation illustrated, the magnetic field sensor 17 is a horizontal Hall sensor. Hall sensors measure a magnetic field on the basis of the Hall effect created by a current being sent through the Hall sensor and a resulting Hall voltage being measured. For measurement purposes, the magnetic field sensor 17 comprises terminals, four terminals 18A to 18D (referred to hereinafter in combination as terminals 18) in the example implementation in FIGS. 1A to 1D. In the illustrated case of a Hall sensor as magnetic field sensor 17, two of the terminals 18 serve for feeding a current, and the other two terminals serve for measuring the Hall voltage. In some example implementations, the magnetic field sensor 17 configured as a Hall sensor is operated using a so-called "spinning current" technique. In this technique, in a plurality of successive phases, different terminals from among the terminals 18 are used for feeding current and for measuring the Hall voltage and the Hall voltages resulting over the phases are combined, whereby an offset and low-frequency flicker noise of the Hall sensor can be substantially eliminated. The spinning current technique is a technique known per se, and is therefore not explained in any greater detail here. The magnetic field sensor 17 can be formed on the chip 13 using semiconductor processes.

While the magnetic field sensor 17 in the example implementation illustrated is a horizontal Hall sensor, e.g. a Hall sensor whose sensitive area lies parallel to a surface of the chip 13, in other example implementations it is also possible to use other types of magnetic field sensors such as vertical Hall sensors, magnetoresistance-based sensors (also known as XMR sensors) or a vortex sensor as described in the present applicant's earlier application having the official file reference U.S. Ser. No. 14/141,660, filed on Dec. 27, 2013. In this case, the sensitive area denotes that area of the magnetic field sensor 17 within which the magnetic field sensor 17 is sensitive to magnetic fields. In other words, only a portion of a magnetic field which passes through the sensitive area contributes to a measurement signal of the magnetic field sensor. In the case of a horizontal Hall sensor, the magnetic field sensor is sensitive to magnetic fields that are perpendicular to the plane of the drawing in FIG. 1A. In the case of other magnetic field sensors, an installation direction of the magnetic field sensors can be chosen such that a sensitivity to magnetic fields perpendicular to the plane of the drawing in FIG. 1A is likewise present.

The magnetic field sensor 17 is sensitive in particular to low-frequency magnetic fields, for example magnetic fields having a frequency of less than 10 kHz including static magnetic fields. For magnetic fields of higher frequencies, the sensitivity of the magnetic field sensor 17 decreases.

For measuring higher-frequency magnetic fields, for example having frequencies above 10 kHz up to 100 kHz or into the MHz range, a coil 15 is provided. The coil 15 is arranged substantially in a plane parallel to the surface of the chip, as evident in particular in the cross-sectional view in FIG. 1B. The coil 15 can be formed in particular in metal plies formed on the chip 13 using semiconductor processes. Other parts of the metal plies are not illustrated, which is why the coil 15 appears to float above the chip 13 in the cross-sectional view in FIG. 1B and the perspective view in FIG. 1C. Here, however, as in some semiconductor processes, a plurality of metal plies are arranged one above another, which are separated by insulation layers (for example silicon dioxide), not illustrated, and which are correspondingly structured in order to form the coil. In this case, the coil 15 is arranged in one of the metal plies. In order to form coil terminals at 16A, 16B, via vertical connections 111A, 111B, as evident in particular in FIG. 1B, it is possible to make contact with a connection 110 in a different metal ply and thus an electrical connection between the interior of the coil 15.

Currents are induced in the coil 15 by magnetic fields that are likewise perpendicular to the plane of the drawing in FIG. 1A. In accordance with the rules of magnetic induction, alternating fields are present here, which has the effect that the coil 15 is sensitive in particular to magnetic fields of higher frequency.

One advantage of the use of a horizontal Hall sensor in some example implementations, therefore, is that the Hall sensor can be fabricated together with a coil using semiconductor processes in such a way that both the Hall sensor and the coil are sensitive to magnetic fields in the same direction.

In the example implementation illustrated, the magnetic field sensor 17 is arranged within an area enclosed by the coil 15. In this case, "arranged within an area enclosed by the coil 15" means that the sensitive area of the magnetic field sensor 17 in the case of an orthogonal projection onto the plane of the coil 15 lies within the area enclosed by the coil 15. In this case, an orthogonal projection is a projection perpendicular to the plane onto which the projection is effected, in this case the plane of the coil. The plane of the coil here is the plane which is defined by the turns of the coil 15, e.g. in which the turns of the coil 15 lie. The orthogonal projection substantially corresponds to the plan view in FIG. 1A.

The area enclosed by the coil is identified by a vertical hatching as area 115 in FIG. 1D and in the context of this application corresponds to an area enclosed by an outermost turn of the coil 15, as is illustrated in FIG. 1D. The plane of the drawing in FIG. 1D here corresponds to the plane of the coil discussed above. The magnetic field sensor 17 thus lies within the area 115 in an orthogonal projection perpendicular to the plane of the coil 15. A projection of this type is indicated by lines 113A-113C for the magnetic field sensor 17 in FIG. 1C.

By virtue of such an arrangement of the magnetic field sensor 17 and of the coil 15, the magnetic field sensor 17 and the coil 15 measure substantially the same magnetic field. This magnetic field can be measured using the combination of coil 15 and magnetic field sensor 17 in some example implementations over a large bandwidth of static magnetic fields into the MHz range with low noise and low offset and high linearity. In addition, the magnetic field sensor 17 as Hall sensor and also the coil 15 can be formed within standard semiconductor processes.

In the case of an arrangement of the chip 13 with the magnetic field sensor 17 and the coil 15 on a leadframe, in the case of some leadframes, eddy currents can occur as a result of the magnetic field to be measured and this can result in magnetic feedback effects into the coil 15 and/or the magnetic field sensor 17, which can corrupt the measurement of the magnetic field, for example can bring about additional noise. In order at least partly to suppress such eddy currents, the leadframe 11 of the magnetic field sensor apparatus 10 comprises a slot 12, that is to say that the slot 12 is cut out from a conductive material of the leadframe 11, typically a metal. In this case in the already mentioned projection perpendicular to the plane of the drawing in FIG. 1A, as indicated by the lines 112A-112B and 113A-113C in FIG. 1C, the coil 15 and the magnetic field sensor 17 lie at least partly above the slot 12 such that the coil 15 and the magnetic field sensor 17 lie at least partly within the slot 12 in the above-described orthogonal projection into the plane of the coil 15. For the slot 12, the orthogonal projection into the plane of the coil 15 is indicated by lines 112A 112C.

In particular, in some example implementations, at least 75% of the sensitive area, in particular at least 90% of the sensitive area or even the entire sensitive area of the magnetic field sensor 17 lies in the slot 12 in this orthogonal projection. Thus, in the orthogonal projection, the sensitive area of the magnetic field sensor 17 can also project somewhat beyond the slot 12, e.g. if the sensitive area is somewhat larger than the slot in one direction, e.g. has 120% of the corresponding dimensioning. However, the sensitive area of the magnetic field sensor can also be correspondingly smaller and lie completely within the slot in the orthogonal projection. In a similar manner, at least 25%, in particular at least 40% or at least 50% of the area 115 enclosed by the outermost turn of the coil 15 lies within the slot 12 in the orthogonal projection. As indicated by a dashed line 19 in FIG. 1A, eddy currents are interrupted and thus suppressed by the slot 12. Consequently, such eddy currents do not disturb the measurement by the magnetic field sensor 17 and the coil 15, or at least disturb it only to a greatly reduced extent. The accuracy of the magnetic field measurement can thereby be measured. Moreover, the bandwidth of the magnetic field sensor 17, which can be reduced by such eddy currents, can be improved. In order to suppress eddy currents, the slot 12 in some example implementations at least in one direction has a larger dimensioning than the area 115 of the coil 15 that is enclosed by the outer turn. In this regard, in the example implementation in FIGS. 1A-1D, the slot 12 has a larger dimensioning than the area 115 of the coil 15 in a direction indicated by an arrow 116. In the example implementation in FIGS. 1A-1D, the slot 12 additionally has a smaller dimensioning than the area 115 of the coil 15 in a direction which, in the plane of the drawing in FIG. 1A, is perpendicular to the direction indicated by the arrow 116.

But it should be noted that in the example implementation in FIG. 1A, the slot 12 does not serve, or does not primarily serve, for passing a current through the leadframe 11, but rather serves, precisely as described, for suppressing eddy currents.

It should additionally be noted that instead of the slot 12 in FIGS. 1A to 1C, other cutouts can also be provided in the conductive material of the leadframe 11 as long as the function of preventing eddy currents, as shown in particular in FIG. 1A, is fulfilled. By way of example, a cross-shaped cutout can also be provided. In this case, too, in some example implementations, the above-explained overlap of the cutout by the magnetic field sensor 17 and/or the coil 18 is applicable, expressed above by what portion of the magnetic field sensor 17 and/or of the coil area 115 of the coil 15 overlaps the slot 12 or in this case some other cutout. However, in this case, too, the cutout at least in one direction can have a larger dimensioning than the area 115 of the coil 15 that is enclosed by the outer turn.

In order to evaluate the signals at the terminals 18A to 18D of the magnetic field sensor 17 and the signals at the terminals 16A, 16B of the coil 15, an evaluation circuit can be provided in the chip 13, or external evaluation circuits can be used. Examples of such evaluation circuits will be explained later with reference to FIGS. 5 to 8.

The magnetic field sensor apparatus in FIGS. 1A to 1C can then be packaged for example in a package, wherein connections toward the outside are provided via the leadframe. Such a magnetic field sensor apparatus in the package can then be used for example to measure magnetic fields generated outside the package, for example in order to measure currents through conductors outside the package through the magnetic field generated by the currents or through other magnetic field-generating devices, as will also be explained later with reference to FIG. 9. The same applies to the other example implementations of magnetic field sensor apparatuses discussed below.

Figure 2:
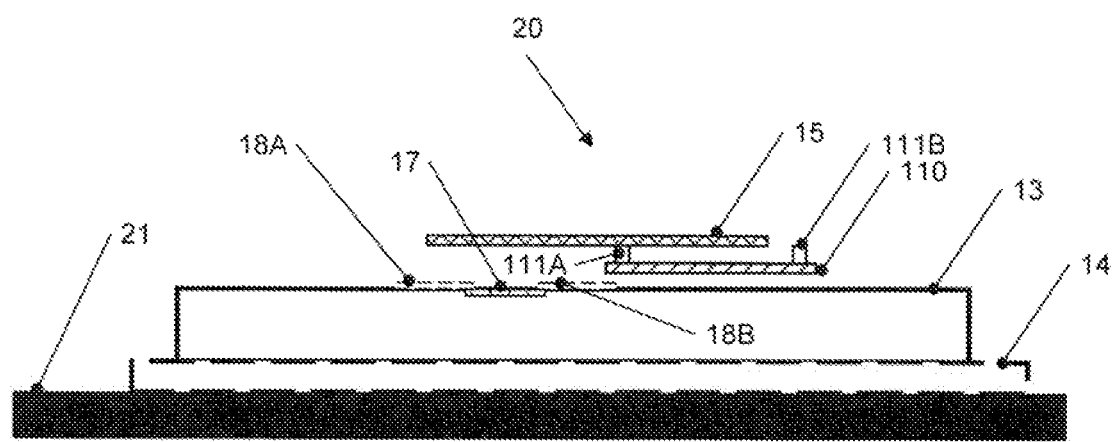
FIG. 2 is a cross-sectional view of a magnetic field sensor apparatus in accordance with a further example implementation.

FIG. 2 shows a cross-sectional view of a magnetic field sensor apparatus 20 in accordance with a further example implementation. In order to avoid repetition, those components which have already been described with reference to FIGS. 1A to 1D bear the same reference signs and will not be explained in detail again.

In particular, the magnetic field sensor apparatus 20 also comprises the chip 13 with the magnetic field sensor 17 and the leads 18 and also the coil 15 with the corresponding terminals, corresponding to the terminals 16A, 16B illustrated in FIG. 1A. As explained in the example implementation in FIGS. 1A to 1D, the magnetic field sensor 17 here is arranged within the area 115 of the coil as defined with reference to FIG. 1D in particular in the orthogonal projection onto the plane of the coil 15. In the example implementation in FIG. 2, the chip 13 is fitted on a carrier 12 using one or more adhesive layers 14 corresponding to the adhesive and insulation layers described with reference to FIG. 1.

In this case, the carrier 12 is a non-conductive carrier, which, however, can comprise metal tracks or other devices for conducting currents. In this case, the non-conductive carrier 21 can comprise for example a printed circuit board (PCB), a ceramic carrier, some other insulator or a ball grid array, such as a so-called "embedded wafer level ball grid array" (eWLB), or combinations thereof. One example of such an embedded wafer level ball grid array in combination with a printed circuit board will be explained in even greater detail later with reference to FIG. 3.

The use of a non-conductive carrier, like the slot 12 in the example implementation in FIGS. 1A to 1D, makes it possible to avoid eddy currents, which increases the accuracy of the measurement. In the case of the orientation of the chip 13 as shown in FIG. 2, in the case of which chip the coil 15 and the magnetic field sensor 17 are fitted on a side of the chip 13 facing away from the carrier 21, the chip 13 additionally serves as a shield vis à vis conductor tracks and other conductors possibly situated on the carrier 21. In the case that the chip is mounted in an opposite way, an additional shield can be provided. A schematic cross-sectional view of a magnetic field sensor apparatus 30 in accordance with an example implementation of this type is illustrated in FIG. 3.

Figure 3:
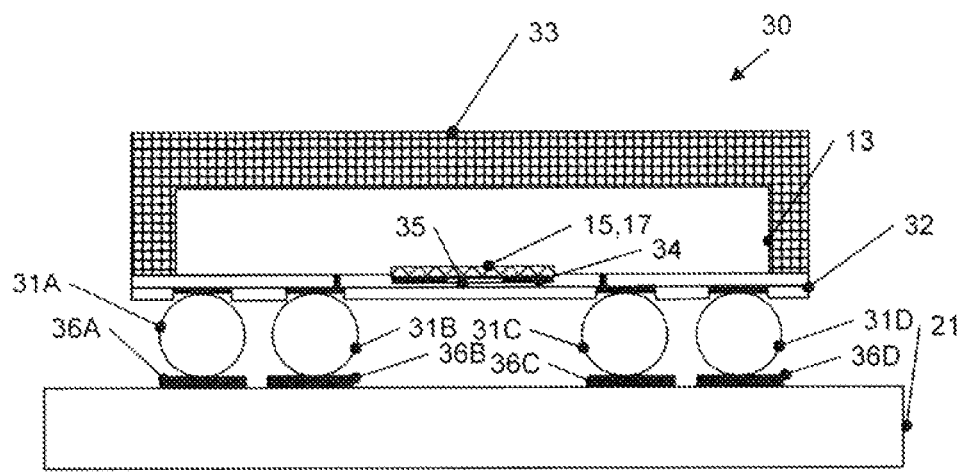
FIG. 3 is a cross-sectional view of a magnetic field sensor apparatus in accordance with a further example implementation.

In the case of the magnetic field sensor apparatus 30 in FIG. 3, the illustration schematically shows the chip 13 with the coil 15 and the magnetic field sensor 17, which has already been described. The chip 13 here is provided with an embedded wafer level ball grid array (eWLB) comprising a distribution layer 32 and solder balls 31A to 31D (referred to in combination as solder balls 31). The number of four illustrated solder balls 31 here should once again be understood merely as an example. The distribution layer 32 relays terminals of the chip 13 to the solder balls 31, such that via the solder balls 31 it is possible to make contact with the chip 13, for example in order to read out possibly processed signals of the coil 15 and of the magnetic field sensor 17. A potting compound 33 envelops the chip 13 on a side facing away from the distribution layer 32. The coil 15 and the magnetic field sensor 17 can be arranged as in the example implementations discussed thoroughly above.

The solder balls 31 are then applied on respective conductor tracks 36A, 36B, 36C, 36D (referred to in combination as conductor tracks 36) of the non-conductive carrier 21, a printed circuit board in this case.

In this case, therefore, in contrast to the arrangement in FIG. 2, the chip 13 does not lie between the coil 15 and the magnetic field sensor 17, on the one hand, and the conductor tracks 36 of the non-conductive carrier 21, on the other hand, and therefore cannot serve as a shield, which could lead to capacitive couplings between the conductor tracks and the coil 15, for example, which can corrupt magnetic field measurements.

In order to avoid this, in the example implementation, an electrically conductive shield 34, in particular a metallic shield, is arranged between coil 15 and magnetic field sensor 17, on the one hand, and the non-conductive carrier 21 having the conductor tracks 36, on the other hand. In order to avoid eddy currents in the shield 34, the latter comprises a slot 35 or some other cutout which with regard to the relative position with respect to the magnetic field sensor 17 and the coil 15 in some example implementations can satisfy the same conditions as discussed for the magnetic field sensor apparatus 10 with reference to FIGS. 1A to 1C. Like the slot 12 in FIGS. 1A to 1C, the slot 35 in the shield 34 prevents or reduces eddy currents in the shield 34. As discussed for the slot 12, cutouts of different shape can also be provided instead of the slot 35.

It should be noted that in some further example implementations a shield with cutout like the cutout 34 can also be provided between the coil 15 and the magnetic field sensor 17 additionally or alternatively in the example implementations in FIGS. 1A-3 discussed above. This can be used in some example implementations in order to shield coil 15 and magnetic field sensor 17 from one another, in particular in order to reduce effects of currents flowing in the coil 15 on the magnetic field sensor 17.

Figure 4:
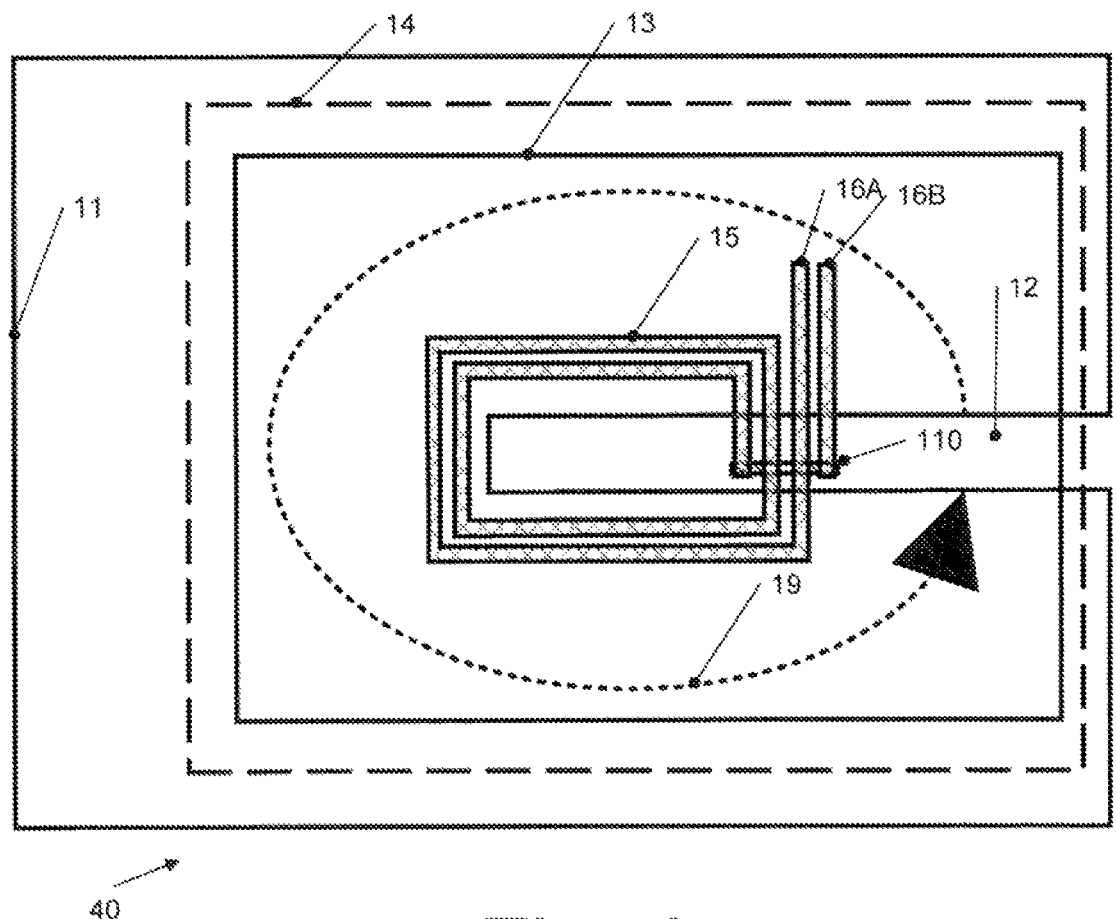
FIG. 4 is a plan view of a magnetic field sensor apparatus in accordance with a further example implementation.

In the example implementations discussed above, in each case a combination of a coil and a magnetic field sensor, in particular a Hall sensor, is used in order to enable magnetic field measurements over a wide frequency range, including static magnetic fields. FIG. 4 shows a plan view of a magnetic field sensor apparatus 40 in accordance with a further example implementation, in which only the coil 15, but not a magnetic field sensor 17, is provided. Apart from the omission of the magnetic field sensor 17, the magnetic field sensor apparatus 40 in FIG. 4 corresponds to the already discussed magnetic field sensor apparatus 10 in FIGS. 1A to 1C and is therefore not explained in further detail.

Next, evaluation circuits for the magnetic field sensor apparatuses discussed above will be explained with reference to FIGS. 5 to 8. The evaluation circuits can be integrated, in particular completely integrated, in the chip 13, such that additional external circuitry, e.g. external capacitances, need not be provided. However, the evaluation circuits can also be external evaluation circuits.

FIGS. 5 to 8 here in each case illustrate the coil 15 and also the magnetic field sensor 17. The magnetic field sensor 17 here is illustrated as a Hall sensor which is supplied with a bias current with respect to ground 51 by a current source 50, wherein a Hall voltage is tapped off at two further terminals of the Hall sensor 17 (cf. the terminals 18A to 18D in FIGS. 1A to 1C). As indicated by an arrow, the magnetic field sensor 17 here is operated using the spinning current technique already discussed, in order at least largely to eliminate an offset of the magnetic field sensor 17.

Figure 5:
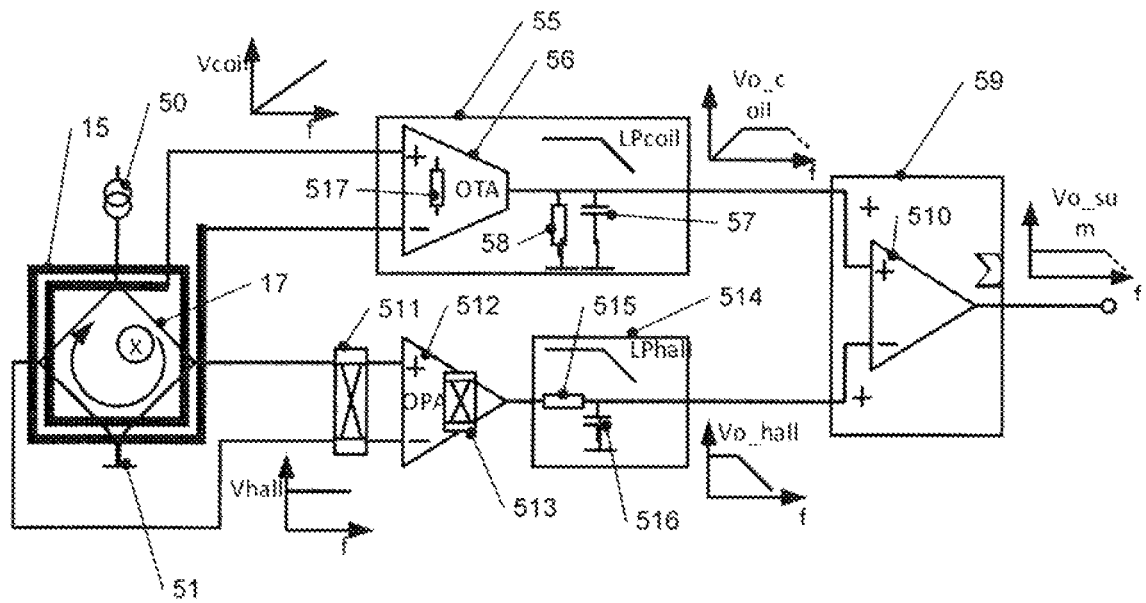
FIGS. 5-8 show evaluation circuits which are usable in magnetic field sensor apparatuses in accordance with various example implementations.

In the example implementation in FIG. 5, a signal generated by the coil 15, the voltage V coil of which signal, as illustrated in FIG. 5, rises with frequency, is fed to a low-pass filter device 55 having a transconductance amplifier 56 (OTA, operational transconductive amplifier), and a resistor 58 and a capacitor 57. The resistor 58 and the capacitor 57 determine a low-pass filter behavior of the low-pass filter device 55. The result is a low-pass-filtered signal illustrated schematically as Vo_coil in FIG. 5. This low-pass-filtered signal is fed to a first input of an operational amplifier 510 of a summing device 59.

The Hall voltage of the magnetic field sensor 17 is substantially constant with the frequency, as indicated for a voltage Vhall. This Hall voltage is fed to a chopper modulator 511, followed by an operational amplifier 512 (OPA, operational amplifier), followed by a chopper demodulator 513. The chopper modulator 511, the operational amplifier 512 and the chopper demodulator 513 together form a chopper amplifier such as is customarily used for amplifying small DC voltages in order to reduce noise, in particular. An output signal of the chopper demodulator 513 is fed to a low-pass filter device 514 having a resistor 515 and a capacitor 516, wherein the resistor 515 and the capacitor 516 in turn determine the frequency behavior of the low-pass filter device 514. The result is a filtered Hall voltage Vo_hall, as likewise illustrated in FIG. 5. The latter is likewise fed to an input of the amplifier 510 in order finally to form a summation output voltage Vo_sum, which is a measure of the magnetic field measured overall by the coil 15 and the magnetic field sensor 17. In this case, the magnetic field sensor 17 supplies a large proportion of the output signal in particular at low frequencies, while the coil 15 determines the output signal Vo_sum at higher frequencies.

In order to ensure a fluid transition between the measurement ranges of the magnetic field sensor apparatus 17 and of the coil 15 which are thus present, the low-pass filter devices 55, 514 are matched to one another with regard to the filter behavior. In this case, filter behavior matched to one another means that the filter behavior is substantially identical e.g. with regard to cut-off frequency and/or time constants. By way of example, the values of the resistors 58, 515 and of the capacitors 57, 516 are chosen such that the cut-off frequencies of the low-pass filters formed are at least approximately identical, for example identical in a range of ±5% or identical within the scope of the production tolerances of the components of the circuit in FIG. 5. If the entire circuit in FIG. 5 is formed on a chip, such as the chip 13, deviations as a result of production tolerances are realized here since, by way of example, process variations affect both the filter device 55 and the filter device 514.

Instead of providing two separate low-pass filter devices 55, 514 matched to one another, as in FIG. 5, it is also possible to provide a common filter device. This is explained with reference to FIG. 6. Components corresponding to those in FIG. 5 bear the same reference signs and will not be explained again.

Figure 6:
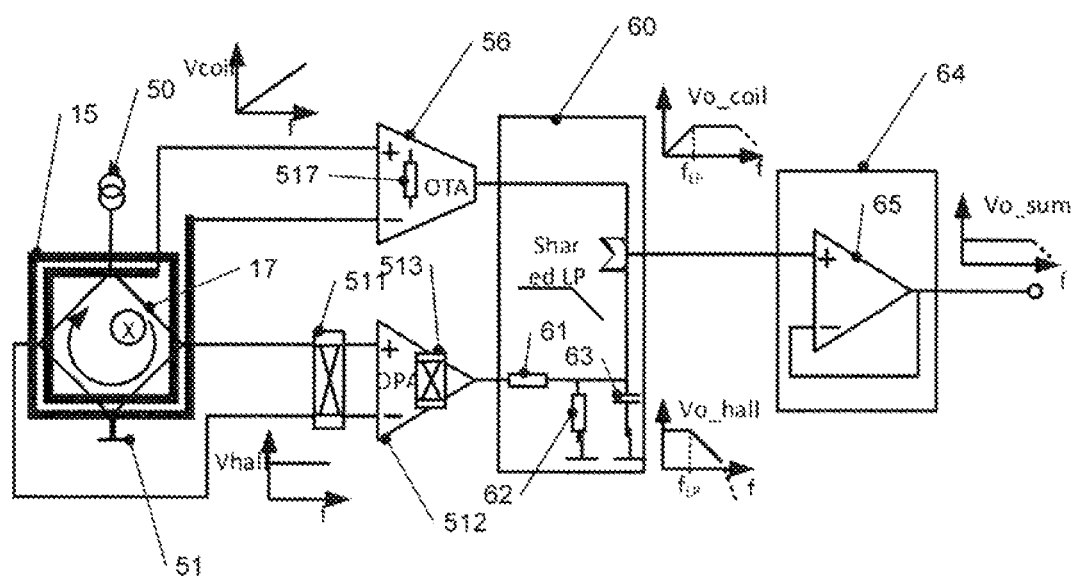

In the example implementation in FIG. 6, an output signal of the transconductance amplifier 56 and an output signal of the chopper demodulator 513 are fed to a common low-pass filter device 60, in which the signals are summed and low-pass-filtered. A low-pass filter arrangement used for this purpose comprises a resistor 61, a resistor 62 and a capacitor 63, the values of which determine a cut-off frequency of the low-pass filter. The signals are thereby filtered and summed to form output signals Vo_coil and Vo_hall as in the example implementation in FIG. 6. In this case, $f_{LP}$ denotes the cut-off frequency of the low-pass filter.

The output signal of the low-pass filter device 60 is also amplified in an amplifier device 64 having a feedback amplifier 65 in order to form the output signal Vo_sum.

Figure 7:
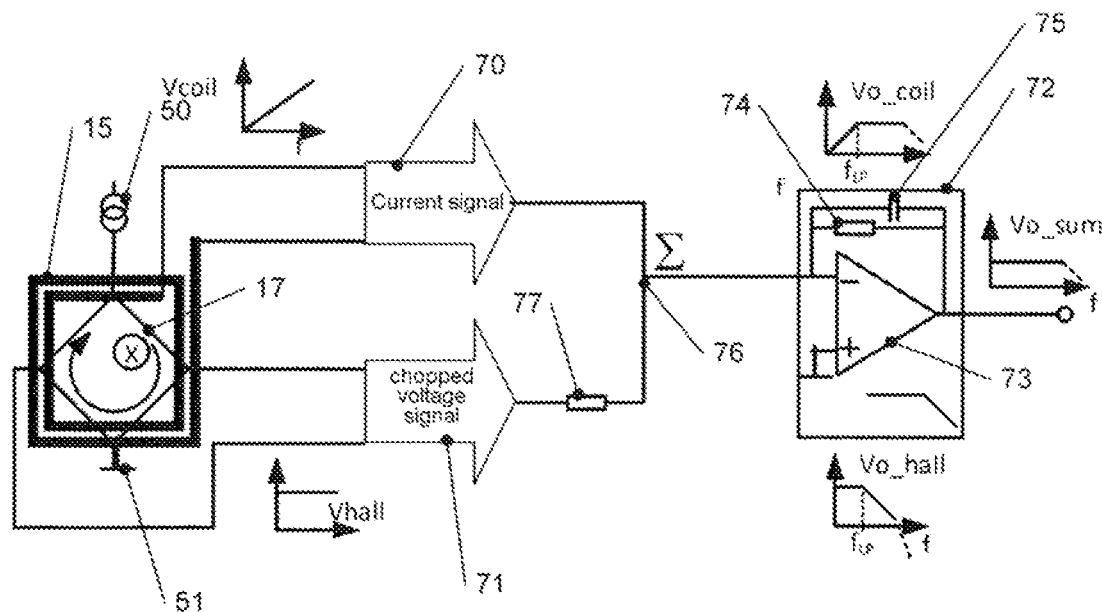

A further example implementation is shown in FIG. 7. Here a current signal from the coil 15 and a chopped voltage signal (for example using a chopper amplifier as shown in FIGS. 5 and 6) are summed at a summation node 76, wherein the chopped voltage signal is fed to the summation node 76 via a resistor 77. As a result of the resistor 77, in this case the voltage signal from the magnetic field sensor 17 becomes a current signal, which is summed with the current signal from the coil at the summation node 76.

The signal thus summed is then fed to an amplifier device 72 comprising an operational amplifier 73. A low-pass filter function is provided by a resistor 74 and a capacitor 75 in a feedback path of the operational amplifier 73. Here, therefore, once again a common low-pass filtering is provided for the already summed signals from coil 15 and magnetic field sensor 17.

Figure 8:
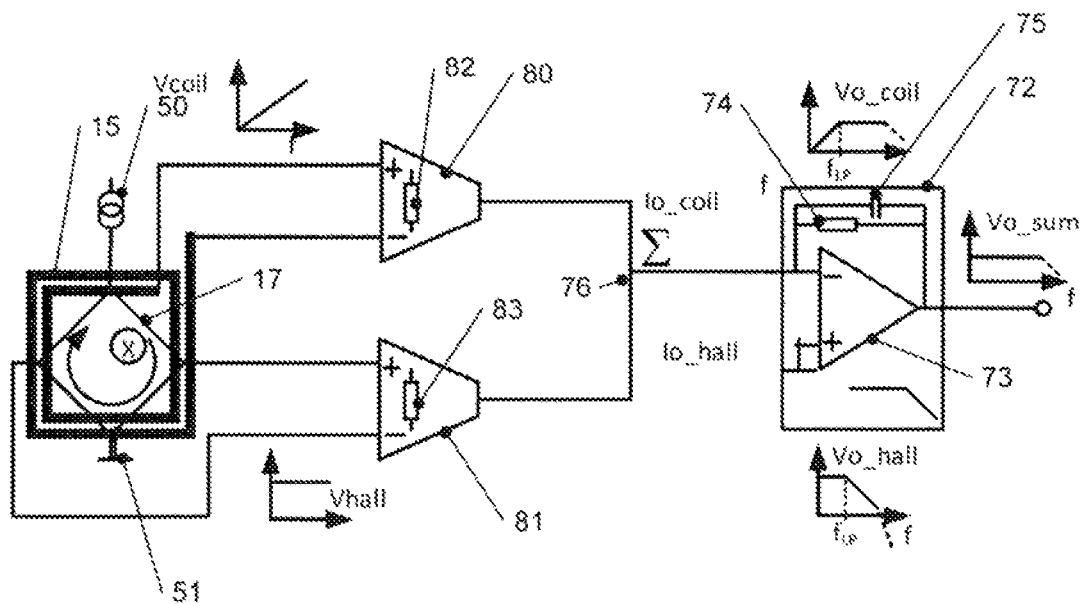

FIG. 8 shows a modification of the example implementation in FIG. 7. Here a current signal Io_coil corresponding to a signal from the coil 15 is provided by a first transconductance amplifier 80. A current signal Io_hall corresponding to the Hall voltage from the magnetic field sensor 17 is provided by a second transconductance amplifier 81. The current signals Io_coil, Io_hall are summed at the summation node 76 already described and are then amplified and low-pass-filtered by the amplifier device 72, likewise already described in FIG. 7.

In the example implementations in FIGS. 5-8, resistors are used for voltage/current conversion, e.g. in order to convert a voltage signal into a current signal, or vice versa. Such resistors can be contained in transconductance amplifiers, such as the resistors 517, 82 and 83, or else external resistors such as the resistor 62. In some example implementations, such resistors are of the same resistor type as resistors of the low-pass filters illustrated, such as e.g. the resistor 74. In this case, "of the same resistor type" means that the resistor is based on the same material and/or is produced by the same process. By way of example, the resistors can be polysilicon resistors produced in a common process.

In some example implementations, this can have the effect of reducing the influence of process and temperature fluctuations on the properties of the evaluation circuit. By way of example, a gain of the amplifier 73 in FIG. 8 is at least partly determined by a ratio of a resistance value of the resistor 74 to resistance values of the resistors 82, 83. If these resistors are of the same resistor type, temperature fluctuations and process fluctuations affect the resistance values in a similar manner, such that fluctuations of the ratio mentioned above can be significantly smaller than the fluctuations of the individual resistance values.

As shown by FIGS. 5 to 8, there are thus various possibilities for processing signals from magnetic field sensor 17 and coil 15 using a mutually matched or common low-pass filtering in order to form an output signal Vo_sum.

In the example implementations shown above, in each case provision is made of a single coil and a single magnetic field sensor, or only a signal coil. In other example implementations, two coils and/or two magnetic field sensors can be interconnected with one another in order to form a differential sensor arrangement.

Figure 10:
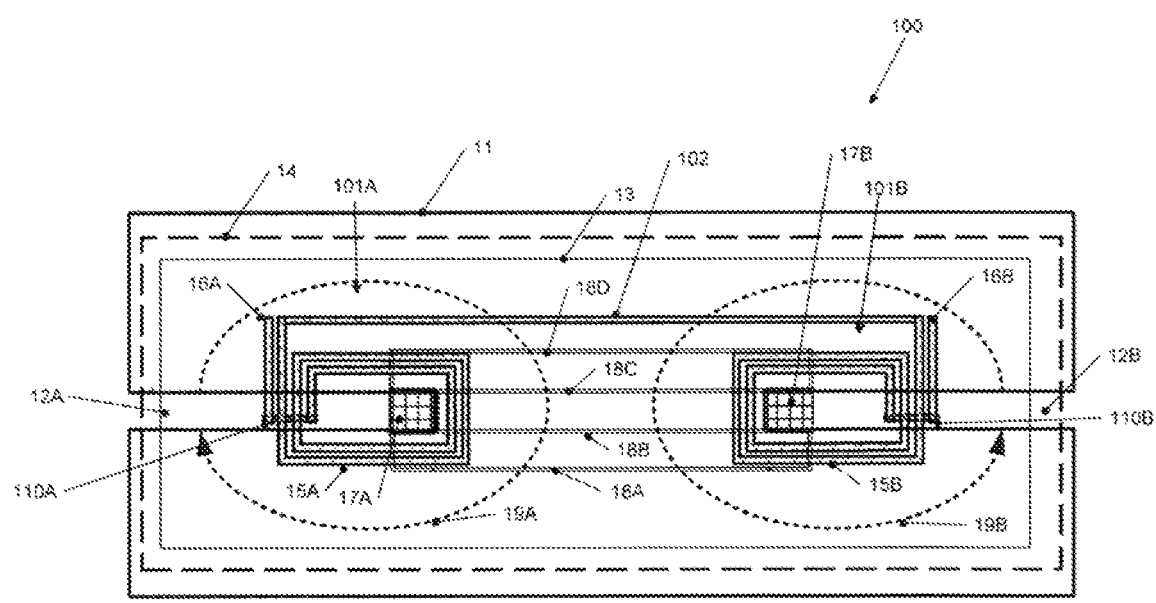
FIG. 10 is a plan view of a magnetic field sensor apparatus in accordance with a further example implementation.

As an example of this, FIG. 10 shows a plan view of a magnetic field sensor apparatus 100 which is based on the magnetic field sensor apparatus 10 in FIGS. 1A-1D and will be described with reference thereto in order to avoid repetition.

Like the magnetic field sensor apparatus 10, the magnetic field sensor apparatus 100 comprises a chip 13 fitted on a leadframe 11 by way of insulation and/or adhesive layers 14. The magnetic field sensor apparatus 100 comprises a first sensor arrangement 101A having a first coil 15A and a first magnetic field sensor 17A, which are arranged above a first slot 12A of the leadframe 11 in the plan view in FIG. 10. Furthermore, the magnetic field sensor apparatus 100 comprises a second sensor arrangement 101B having a second coil 15B and a second magnetic field sensor 17B, which are arranged above a second slot 12B of the leadframe 11 in the plan view in FIG. 10. For each of the sensor arrangements 101A, 101B, the explanations given concerning the coil 15, the magnetic field sensor 17 and the slot 12 with reference to FIGS. 1A-1D are applicable with regard to configuration and arrangement of the respective coil 15A and 15B, the respective magnetic field sensor 17A and 17B and the respective slot 12A and 12B.

The coils 15A, 15B are interconnected via a connection 102 to form a differential coil arrangement and are contactable via connections 110A, 110B and terminals 16A, 16B. The magnetic field sensors 17A, 17B are interconnected via the terminals 18A-18D to form a differential magnetic field sensor arrangement. As in FIGS. 1A-1D, in addition, a bias current is fed via two of the terminals 18A-18D, and a Hall voltage is measured via the other two of the terminals 18A-18D. The "spinning current" technique mentioned can be employed here as well. The evaluation circuits from FIGS. 5-8 can also be used for the magnetic field sensor apparatus 100.

As a result of the differential interconnection, effectively only a magnetic field difference between the locations of the sensor arrangements 101A, 101B contributes to a measurement result, while a homogeneous magnetic field which is identical at the locations of the sensor arrangements 101A, 101B makes no contribution. This can be used for example to suppress influences on the magnetic field measurement by a leakage field that is approximately homogeneous on the scale of the spacing of the sensor arrangements 101A, 101B.

Figure 9:
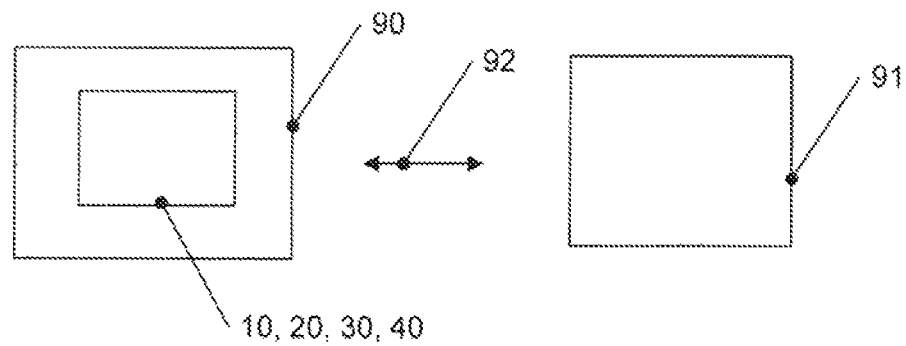
FIG. 9 shows a system in accordance with one example implementation.

FIG. 9 shows a system as an application example for magnetic field sensor apparatuses in accordance with the example implementations described. FIG. 9 shows the magnetic field sensor apparatus 10 from FIG. 1, 20 from FIG. 2, 30 from FIG. 3, 40 from FIG. 4 or 100 from FIG. 10 in a package 90. A magnetic field generator 91 outside the package 90 generates a magnetic field 92, which in particular can be a radio-frequency magnetic field and/or can have radio-frequency components. The magnetic field generator 91 can be for example a conductor through which current flows, a radio-frequency coil or some other apparatus that generates a magnetic field which is intended to be measured. The magnetic field 92 can then be measured by the magnetic field sensor apparatus 10, 20, 30, 40 or 100. Application examples comprise so-called closed-loop current sensors, in which the magnetic field sensor apparatus 10, 20, 30, 40 or 100 is arranged in a slotted magnetic toroidal core. A current to be measured flows through a second turn of the toroidal core, which thus serves as a magnetic field generator 91. Other applications comprise position and rotational speed measurements that measure a magnetic field which is dependent on a position of an element (e.g. using a magnet fitted to the element) or on a rotational speed (e.g. using rotation of a pole wheel). Examples of a position measurement include a measurement of a valve position. Using the magnetic field sensor apparatuses described, it is possible here to detect in particular fast movements with low jitter.

Although specific example implementations have been illustrated and described in this description, persons having routine knowledge in the art will recognize that a multiplicity of alternative and/or equivalent implementations can be chosen as substitution for the specific example implementations shown and described in this description, without departing from the scope of the implementation shown. The intention is for this application to cover all adaptations or variations of the specific example implementations discussed here. Therefore, the intention is for this implementation to be restricted only by the claims and the equivalents of the claims.

The invention claimed is:

1. A magnetic field sensor apparatus, comprising:
   a non-conductive carrier; and
   a chip fitted on the non-conductive carrier and comprising
      a first magnetic field sensor, a second magnetic field sensor, a first coil, associated with the first magnetic field sensor, having first turns, and a second coil, associated with the second magnetic field sensor, having second turns; and
   an electrically conductive shield comprising a first cutout and a second cutout,
      wherein the first cutout extends beyond a first outer turn of the first turns,
      wherein the second cutout extends beyond a second outer turn of the second turns, in an opposite direction of the first cutout,
      wherein the first magnetic field sensor comprises a sensitive area lying within an area enclosed by the first outer turn, of the first turns, in plan view, and
      wherein the first magnetic field sensor is at least partially arranged over the first cutout.

2. The magnetic field sensor apparatus of claim 1, wherein the non-conductive carrier comprises a printed circuit board.

3. The magnetic field sensor apparatus of claim 1, wherein the first magnetic field sensor and the first coil are formed on a side of the chip which faces away from the non-conductive carrier.

4. The magnetic field sensor apparatus of claim 3, wherein the first coil and the first magnetic field sensor are arranged on a first side of the electrically conductive shield, and wherein the non-conductive carrier is arranged on an opposite side of the electrically conductive shield relative to the first side.

5. The magnetic field sensor apparatus of claim 1,
   wherein the second coil is interconnected with the first coil in a differential arrangement, and the second magnetic field sensor is interconnected with the first magnetic field sensor in a differential arrangement, and
   wherein the second magnetic field sensor comprises a second sensitive area lying within a second area enclosed by the second outer turn, in plan view.

6. The magnetic field sensor apparatus of claim 1, further comprising:
   an evaluation circuit configured to filter a first signal, associated with the first magnetic field sensor, and a second signal, associated with the first coil, using low-pass filter devices, matched to one another with regard to filter behavior, or using a common low-pass filter device.

7. The magnetic field sensor apparatus of claim 6, wherein the evaluation circuit comprises one or more of a first resistor or a second resistor,
   wherein the low-pass filter devices or the common low-pass filter device include a resistor, and
   wherein the one or more of the first resistor or the second resistor are a resistor type identical to the resistor of the low-pass filter devices or the common low-pass filter device.

8. The magnetic field sensor apparatus of claim 6, wherein the evaluation circuit is integrated into the chip.

9. The magnetic field sensor apparatus of claim 1, wherein the magnetic field sensor is a horizontal Hall sensor.

10. A device, comprising:
    a chip comprising a first magnetic field sensor, a second magnetic field sensor, a first coil, associated with the first magnetic field sensor, having first turns, and a second coil, associated with the second magnetic field sensor, having second turns; and
    an electrically conductive shield comprising a first cutout and a second cutout,
       wherein the first cutout extends beyond a first outer turn of the first turns,
       wherein the second cutout extends beyond a second outer turn of the second turns, in an opposite direction of the first cutout,
       wherein the first magnetic field sensor comprises a sensitive area lying within an area enclosed by the first outer turn, of the first turns, in plan view, and
       wherein the first magnetic field sensor is at least partially arranged over the first cutout.

11. The device of claim 10, wherein the second coil is interconnected with the first coil in a differential arrangement, and the second magnetic field sensor is interconnected with the first magnetic field sensor in a differential arrangement, and
    wherein the second magnetic field sensor comprises a second sensitive area lying within a second area enclosed by the second outer turn, in plan view.

12. The device of claim 10, further comprising:
    an evaluation circuit configured to filter a first signal, associated with the first magnetic field sensor, and a second signal, associated with the first coil, using low-pass filter devices, matched to one another with regard to filter behavior, or using a common low-pass filter device.

13. The device of claim 12, wherein the evaluation circuit comprises one or more of a first resistor or a second resistor,
    wherein the low-pass filter devices or the common low-pass filter device include a resistor, and
    wherein the one or more of the first resistor or the second resistor are a resistor type identical to the resistor of the low-pass filter devices or the common low-pass filter device.

14. The device of claim 12, wherein the evaluation circuit is integrated into the chip.

15. The device of claim 10, wherein the first magnetic field sensor is a horizontal Hall sensor.

16. A system, comprising:
    a magnetic field sensor apparatus arranged in a package and comprising:
       a chip comprising a first magnetic field sensor, a second magnetic field sensor, a first coil, associated with the first magnetic field sensor, having first turns, and a second coil, associated with the second magnetic field sensor, having second turns; and an electrically conductive shield comprising a first cutout and a second cutout,
  wherein the first cutout extends beyond a first outer turn of the first turns,
  wherein the second cutout extends beyond a second outer turn of the second turns, in an opposite direction of the first cutout,
  wherein the first magnetic field sensor comprises a sensitive area lying within an area enclosed by the first outer turn, of the first turns, in plan view, and
  wherein the first magnetic field sensor is at least partially arranged over the first cutout.

17. The magnetic field sensor apparatus of claim 16, wherein the second coil is interconnected with the first coil in a differential arrangement, and the second magnetic field sensor is interconnected with the first magnetic field sensor in a differential arrangement, and
  wherein the second magnetic field sensor comprises a second sensitive area lying within a second area enclosed by the second outer turn, in plan view.

18. The magnetic field sensor apparatus of claim 16, further comprising:
  an evaluation circuit configured to filter a first signal, associated with the first magnetic field sensor, and a second signal, associated with the first coil, using low-pass filter devices, matched to one another with regard to filter behavior, or using a common low-pass filter device.

* * * * *